United States Patent
Duan et al.

(10) Patent No.: US 12,557,474 B2
(45) Date of Patent: Feb. 17, 2026

(54) SILICON-BASED ORGANIC ELECTROLUMINESCENT DISPLAY SUBSTRATE WITH OLED CATHODE INCLUDING CONDUCTIVE SCATTERING SUBSTRUCTURE, MANUFACTURING METHOD THEREOF AND DISPLAY PANEL

(71) Applicants: Yunnan Invensight Optoelectronics Technology Co., Ltd., Yunnan (CN); BOE TECHNOLOGY GROUP CO., LTD., Beijing (CN)

(72) Inventors: Dongdong Duan, Beijing (CN); Xiaochuan Chen, Beijing (CN); Hui Wang, Beijing (CN); Shengji Yang, Beijing (CN); Pengcheng Lu, Beijing (CN); Xiaobin Shen, Beijing (CN); Yu Wang, Beijing (CN); Xiong Yuan, Beijing (CN); Hui Tong, Beijing (CN); Kuanta Huang, Beijing (CN)

(73) Assignees: Yunnan Invensight Optoelectronics Technology Co., Ltd., Yunnan (CN); BOE TECHNOLOGY GROUP CO., LTD., Beijing (CN)

( * ) Notice: Subject to any disclaimer, the term of this patent is extended or adjusted under 35 U.S.C. 154(b) by 945 days.

(21) Appl. No.: 17/772,623

(22) PCT Filed: Jun. 22, 2021

(86) PCT No.: PCT/CN2021/101474
§ 371 (c)(1),
(2) Date: Apr. 28, 2022

(87) PCT Pub. No.: WO2021/259241
PCT Pub. Date: Dec. 30, 2021

(65) Prior Publication Data
US 2022/0399527 A1  Dec. 15, 2022

(30) Foreign Application Priority Data

Jun. 23, 2020 (CN) .......................... 202010580548.3

(51) Int. Cl.
*H10K 59/121* (2023.01)
*H10K 59/80* (2023.01)

(52) U.S. Cl.
CPC ... *H10K 59/1213* (2023.02); *H10K 59/80518* (2023.02); *H10K 59/80524* (2023.02); *H10K 59/876* (2023.02); *H10K 59/877* (2023.02)

(58) Field of Classification Search
CPC .. H10K 50/818; H10K 50/852; H10K 50/854; H10K 59/80518; H10K 59/876; H10K 59/877
(Continued)

(56) References Cited

U.S. PATENT DOCUMENTS

| 2005/0184650 A1 | 8/2005 | Peng et al. |
| 2006/0125387 A1 | 6/2006 | Adachi et al. |

(Continued)

FOREIGN PATENT DOCUMENTS

| CN | 1498046 A | 5/2004 |
| CN | 1967901 A | 5/2007 |

(Continued)

OTHER PUBLICATIONS

China Patent Office, Second Office Action issued Dec. 14, 2022 for application No. CN202010580548.3.
(Continued)

*Primary Examiner* — Bumsuk Won
(74) *Attorney, Agent, or Firm* — HOUTTEMAN LAW LLC

(57) ABSTRACT

Provided are a silicon-based organic electroluminescent display substrate, a manufacturing method thereof, and a
(Continued)

display panel. The display substrate includes: a silicon-based substrate and pixel units thereon. Each of the pixel units includes: a first electrode on a side of the silicon-based substrate; a light emitting layer on a side of the first electrode away from the silicon-based substrate; and a second electrode on a side of the light emitting layer away from the first electrode. The second electrode of each of the pixel units includes at least one composite structure including: a first metal film layer on a side of the light emitting layer away from the first electrode; a conductive scattering sub-structure on a side of the first metal film layer away from the light emitting layer; and a second metal film layer on a side of the conductive scattering sub-structure away from the first metal film layer.

13 Claims, 7 Drawing Sheets

(58) Field of Classification Search
USPC .......................................................... 257/40
See application file for complete search history.

(56) References Cited

U.S. PATENT DOCUMENTS

| | | | |
|---|---|---|---|
| 2006/0186802 A1 | 8/2006 | Cok et al. | |
| 2008/0237612 A1 | 10/2008 | Cok et al. | |
| 2008/0297045 A1* | 12/2008 | Cok | B82Y 30/00 |
| | | | 313/506 |
| 2009/0278450 A1* | 11/2009 | Sonoyama | H10K 59/38 |
| | | | 313/504 |
| 2011/0042696 A1 | 2/2011 | Smith et al. | |
| 2013/0228786 A1 | 9/2013 | Park | |
| 2015/0064826 A1* | 3/2015 | Jo | H10D 86/0212 |
| | | | 438/34 |
| 2016/0149154 A1 | 5/2016 | Park et al. | |
| 2018/0052366 A1 | 2/2018 | Hao et al. | |
| 2018/0151824 A1 | 5/2018 | Park et al. | |
| 2020/0161585 A1 | 5/2020 | Palles-Dimmock et al. | |
| 2021/0126220 A1* | 4/2021 | Li | H10K 50/854 |

FOREIGN PATENT DOCUMENTS

| | | | | |
|---|---|---|---|---|
| CN | 101094543 | A | | 12/2007 |
| CN | 103872261 | A | | 6/2014 |
| CN | 104362171 | A | | 2/2015 |
| CN | 105161631 | A | | 12/2015 |
| CN | 105702876 | A | * | 6/2016 |
| CN | 105870358 | A | | 8/2016 |
| CN | 106571431 | A | | 4/2017 |
| CN | 106953020 | A | | 7/2017 |
| CN | 107507920 | A | | 12/2017 |
| CN | 108682681 | A | | 10/2018 |
| CN | 109427845 | A | | 3/2019 |
| CN | 109728198 | A | | 5/2019 |
| CN | 109802050 | A | | 5/2019 |
| CN | 110462870 | A | | 11/2019 |
| CN | 110729407 | A | | 1/2020 |
| CN | 210723031 | U | * | 6/2020 |
| CN | 111682051 | A | | 9/2020 |
| IN | 104253242 | A | | 12/2014 |

OTHER PUBLICATIONS

China Patent Office, First Office Action issued May 20, 2022 for application No. CN202010580548.3.
Shihao Liu, "Research on organic light-emitting devices based on sliver/germanium/sliver transparent electrode," Master's Thesis, Aug. 15, 2015, Jilin University, Changchun, China. English Abstract.
China Patent Office, Third Office Action, issued May 10, 2023, Appl'n. No. CN202010580548.3.

* cited by examiner

SILICON-BASED ORGANIC ELECTROLUMINESCENT DISPLAY SUBSTRATE WITH OLED CATHODE INCLUDING CONDUCTIVE SCATTERING SUBSTRUCTURE, MANUFACTURING METHOD THEREOF AND DISPLAY PANEL

CROSS-REFERENCE TO RELATED APPLICATIONS

The present application claims the priority of the Chinese Patent Application No. 202010580548.3, filed on Jun. 23, 2020, the contents of which are incorporated herein in their entirety by reference.

TECHNICAL FIELD

The present disclosure relates to the field of display technology, and in particular, to a silicon-based organic electroluminescent display substrate, a manufacturing method thereof, and a display panel.

BACKGROUND

An organic light emitting diode device or an organic electroluminescent device (OLED) has a basic structure including a cathode, an anode, and an organic electroluminescent material between the cathode and the anode. In order to improve luminescent performance of the OLED device, a non-organic material may be added to improve various performance indexes of the light emitting device. One of the cathode and anode of the OLED device must be transparent/translucent in the visible-light region. After a bias voltage is applied to the OLED device, electrons and holes are injected into a light emitting layer from the cathode and the anode, respectively. The electrons and the holes form excitons in the light emitting layer, and the excitons are electrons in an excited state. The excitons recombine in the light emitting layer, thereby releasing energy in the form of light.

SUMMARY

According to an aspect of the present disclosure, a silicon-based organic electroluminescent display substrate is provided. The silicon-based organic electroluminescent display substrate includes a silicon-based substrate and a plurality of pixel units on the silicon-based substrate. Each of the plurality of pixel units includes: a first electrode on a side of the silicon-based substrate; a light emitting layer on a side of the first electrode away from the silicon-based substrate; and a second electrode on a side of the light emitting layer away from the first electrode, wherein the second electrode of at least one of the plurality of pixel units includes at least one composite structure including: a first metal film layer on a side of the light emitting layer away from the first electrode; a conductive scattering sub-structure on a side of the first metal film layer away from the light emitting layer; and a second metal film layer on a side of the conductive scattering sub-structure away from the first metal film layer.

In some embodiments, the first electrode is a reflective electrode, and the second electrode is a transmissive electrode.

In some embodiments, the second electrode has a thickness in a range from 12 nm to 20 nm in a direction perpendicular to the silicon-based substrate.

In some embodiments, the conductive scattering sub-structure includes a conductive scattering film layer.

In some embodiments, the conductive scattering film layer has a thickness in a range from 2 nm to 7 nm in a direction perpendicular to the silicon-based substrate.

In some embodiments, the conductive scattering sub-structure includes a plurality of conductive scattering blocks.

In some embodiments, the plurality of conductive scattering blocks each have a thickness in a range from 5 nm to 20 nm in a direction perpendicular to the silicon-based substrate.

In some embodiments, a sum of areas of orthographic projections of the plurality of conductive scattering blocks on the silicon-based base is 30% to 70% of an area of an orthographic projection of the first electrode on the silicon-based base.

In some embodiments, the orthographic projections of the plurality of conductive scattering blocks on the silicon-based substrate are uniformly distributed on the silicon-based substrate.

In some embodiments, shapes of the orthographic projections of the plurality of conductive scattering blocks on the silicon-based substrate are the same, and are the same as a shape of the orthographic projection of the first electrode on the silicon-based substrate.

In some embodiments, a material of the conductive scattering sub-structure has carrier mobility in a range from $10^{-4}$ $cm^2V^{-1}s^{-1}$ to $10\ cm^2V^{-1}s^{-1}$, and an optical energy gap of the material of the conductive scattering sub-structure is greater than 2.5 eV.

In some embodiments, the material of the conductive scattering sub-structure includes an organic semiconductor material, an inorganic semiconductor material, a doped inorganic semiconductor material or a doped organic semiconductor material.

In some embodiments, the organic semiconductor material includes 8-hydroxyquinoline aluminium, bathophenanthroline and 2, 9-dimethyl-4, 7-biphenyl-1, 10-phenanthroline.

In some embodiments, the inorganic semiconductor material includes a carbon material, and the carbon material includes at least one of graphene, a nanocarbon material, a carbon fiber, and a carbonic material.

In some embodiments, a dopant material in the doped inorganic semiconductor material or the doped organic semiconductor material includes at least one of lithium fluoride, 8-hydroxyquinoline lithium, lithium, magnesium phosphide, magnesium fluoride, and aluminum oxide.

In some embodiments, a material of the first and second metal film layers includes at least one of a magnesium silver alloy and a silver alloy.

According to an aspect of the present disclosure, a display panel is provided. The display panel includes the above display substrate and a driving circuit for driving the display substrate.

According to an aspect of the present disclosure, a method for manufacturing the above silicon-based organic electroluminescent display substrate is provided. The method includes: providing a silicon-based substrate; forming a first electrode on the silicon-based substrate; forming a light emitting layer on a side of the first electrode away from the silicon-based substrate, and forming a second electrode on a side of the light emitting layer away from the first electrode, such that the second electrode includes at least one composite structure including: a first metal film layer on a side of the light emitting layer away from the first electrode; a conductive scattering sub-structure on a side of the first metal film layer away from the light emitting layer; and a second metal film layer on a side of the conductive scattering sub-structure away from the first metal film layer.

In some embodiments, forming the second electrode includes: forming the first metal film layer on the light emitting layer; forming a conductive scattering film layer on the first metal film layer; and forming the second metal film layer on the conductive scattering film layer.

In some embodiments, forming the second electrode includes: forming the first metal film layer on the light emitting layer; forming a conductive scattering layer on the first metal film layer, and patterning the conductive scattering layer to form a plurality of island-shaped conductive scattering blocks; and forming the second metal film layer on the conductive scattering blocks to cover the plurality of conductive scattering blocks.

BRIEF DESCRIPTION OF DRAWINGS

The accompanying drawings are provided for further understanding of the present disclosure, constitute a part of this specification and are intended to explain the present disclosure together with the following embodiments, but not intended to limit the present disclosure.

DETAIL DESCRIPTION OF EMBODIMENTS

Figure 1A:
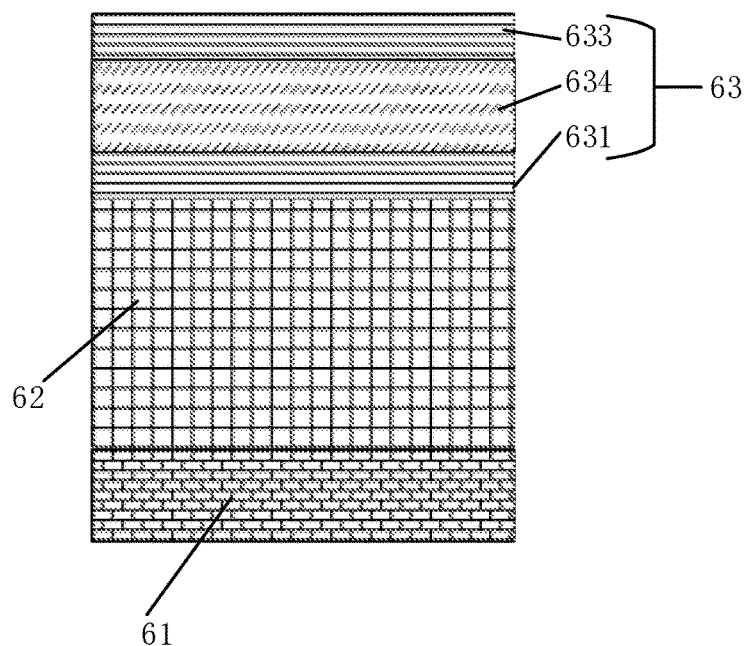
FIG. 1A is a schematic diagram of a structure of an OLED device according to an embodiment of the present disclosure.

The following detailed description of the embodiments of the present disclosure refers to the accompanying drawings. It should be understood that the specific embodiments described herein are only used to illustrate and explain the present disclosure, but not to limit the present disclosure.

A method for controlling a color of the light emitted by an OLED device includes adjusting luminescent characteristics of a light emitting material, and controlling an optical gain through modulating a reflectivity of an electrode and adjusting a length of a resonant cavity (i.e., adjusting a thickness of the OLED device) (through Fabry-Perot resonance mechanism). Through Fabry-Perot resonance mechanism, luminescent purity may be improved to a level close to monochromatic light (single wavelength or narrow half-width). In display applications or special lighting applications, when a strong resonant cavity is achieved by the Fabry-Perot resonance mechanism, the color of the light in the applications is matched. For example, the three primary colors of blue, green, and red required for display applications or the deep red color gamut of automotive taillights may be achieved by using various light emitting materials with the Fabry-Perot resonance mechanism.

A variety of light emitting materials may be used in an OLED device to adjust the color of the emitted light. The intensity of the Fabry-Perot resonance mechanism may be controlled to adjust the overall light color in the applications of an OLED emitting white light, such as illumination of an OLED emitting white light or W-OLED displaying (adopting white light and color filters).

The key elements for achieving the Fabry-Perot resonance mechanism in an OLED device include: a reflective electrode of high reflectivity, a semi-transmissive electrode and an optical resonant cavity. The reflective electrode of high reflectivity generally has a reflective surface made of a metal material such as silver or an alloy thereof, aluminum or an alloy thereof, which has an outer surface as a metal protective layer made of a metal oxide of high transmission, and an injection work function of the reflective electrode is adjusted to match the OLED device. The semi-transmissive electrode is generally a coating film of a thin metal layer, such as silver, a magnesium-silver alloy or a combination thereof, and the transmission thereof may be adjusted in a range from 15% to 60% under a thickness in a range from 8 nm to 20 nm. A strong Fabry-Perot resonance mechanism may be achieved by an electrode of low transmission, thereby obtaining required light with a pure color, but a total light intensity may be reduced accordingly. A spectrum of strong light intensity may be achieved by an electrode of high transmission, but Fabry-Perot resonance mechanism effect is reduced. To increase the conductivity of the semi-transmissive electrode, a conductive metal oxide may be used to improve the conductive characteristics of the semi-transmissive electrode and maintain the optical effect. The optical resonant cavity is a structure starting from the transparent electrode on the anode surface and ending at the contact surface between the cathode metal and the OLED functional material. A proper structure of an OLED device is configured considering various optical influence factors.

In a silicon-based OLED display, various methods may be used for achieving full color, such as white light in cooperation with color adjusting of a strong optical microcavity, white light in cooperation with color filters, monochromatic light devices of red, green and blue, and the like. Since mass production is easy to realize by the white light in cooperation with color filters, the white light in cooperation with color filters is commonly used. However, in practice, the silicon-based substrate has a surface microstructure much more complicated than that of a large, medium or small size OLED display, resulting in severe unevenness. The reason resulting in the above case lies in a distance of less than 2 um between pixels required for an ultra-high resolution display in a silicon-based OLED display, which is contrary to a distance of more than 20 um between pixels in production experience of a large, medium or small size display to avoid completely adverse interaction between pixels (called cross color or lateral electric leakage/light leakage). Therefore, various different mechanism designs are utilized to avoid adverse interaction between pixels, and the design difficulty of the optical structure and the semi-transmissive electrode of the OLED device emitting white light may be significantly increased.

Figure 1B:
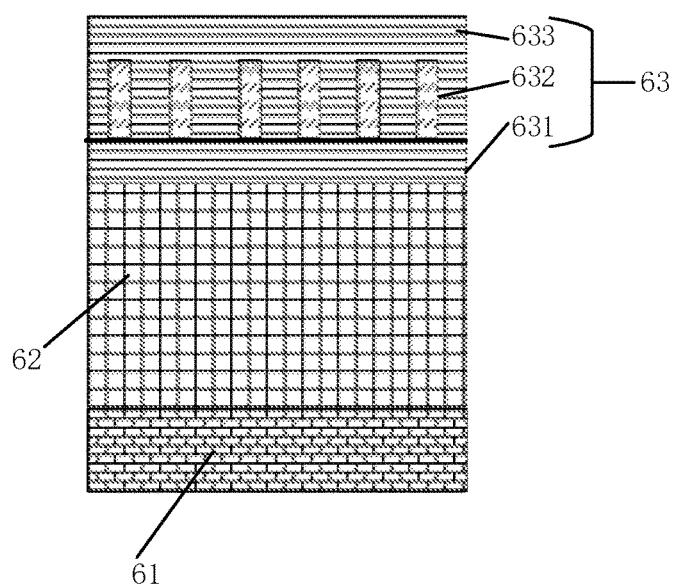
FIG. 1B is a schematic diagram of a structure of an OLED device according to an embodiment of the present disclosure.

In order to solve the above problems, the present disclosure provides a silicon-based organic electroluminescent display substrate. FIG. 1A is a schematic diagram of a structure of an OLED device in a pixel unit in the silicon-based organic electroluminescent display substrate according to an embodiment of the present disclosure. FIG. 1B is a schematic diagram of a structure of an OLED device according to another embodiment of the present disclosure. The silicon-based organic electroluminescent display substrate includes a silicon-based substrate and a plurality of pixel units on the silicon-based substrate. Each of the plurality of pixel units includes an OLED device. As shown in FIGS. 1A and 1B, the OLED device includes: a first electrode 61 as a reflective electrode on a side of the silicon-based substrate; a light emitting layer 62 on a side of the first electrode 61 away from the silicon-based substrate; and a second electrode 63 as a transmissive electrode on a side of the light emitting layer 62 away from the first electrode 61. The second electrode of at least one of the plurality of pixel units includes at least one composite structure including: a first metal film layer 631 on a side of the light emitting layer 62 away from the first electrode 61; a conductive scattering sub-structure on a side of the first metal film layer 631 away from the light emitting layer 62; and a second metal film layer 633 on a side of the conductive scattering sub-structure away from the first metal film layer 631. The conductive scattering sub-structure may have different structures, such as a conductive scattering film covering the entire first metal film layer 631, or a plurality of conductive scattering blocks between the first and second metal film layers. The conductive scattering sub-structure is described in detail below with reference to the two specific structures.

As shown in FIG. 1A, the second electrode 63 includes at least one composite structure including: a first metal film layer 631 on a side of the light emitting layer 62 away from the first electrode 61; a conductive scattering film layer 634 on a side of the first metal film layer 631 away from the light emitting layer 62; and a second metal film layer 633 on a side of the conductive scattering film layer 634 away from the first metal film layer 631.

As shown in FIG. 1B, the second electrode 63 includes at least one composite structure including: a first metal film layer 631 on a side of the light emitting layer 62 away from the first electrode 61; a plurality of conductive scattering blocks 632 on a side of the first metal film layer 631 away from the light emitting layer 62; and a second metal film layer 633 on a side of the plurality of conductive scattering blocks 632 away from the first metal film layer 631.

In the present disclosure, the second electrode 63 of the OLED device includes one or more composite structures of metal-conductive material-metal; and the composite structure includes two metal film layers, and a plurality of conductive scattering blocks or a conductive scattering film layer embedded between the two metal film layers, which can effectively maintain the conductive characteristics of the second electrode, and simultaneously improve the optical characteristics of the second electrode, thereby effectively improving the light extraction of the OLED device. Moreover, the second electrode 63 may include a plurality of composite structures stacked in a direction perpendicular to the silicon-based substrate.

In the related art, the thickness of the electrode used in the optical resonant cavity for top emission is in a range from 8 nm to 12 nm, and the optical transmission may be controlled in a range from about 40% to 60%. However, in the related art, the thickness of the electrode suitable for the OLED device basically falls in a range from 12 nm to 20 nm to ensure normal conductive characteristics of the electrode, but the optical transmission falls below 40% or even less than 10%, and the final light emitting is seriously influenced.

However, when the total thickness of the second electrode 63 with at least one composite structure of the present disclosure is in a range from 12 nm to 20 nm, the light transmission of the second electrode is greater than that of a metal film layer with the same thickness due to the transparent conductive scattering film layer 634 or the plurality of conductive scattering blocks 632 therein. Also, since the transparent conductive scattering film layer 634 or the plurality of conductive scattering blocks 632 have an electrical conductive characteristic, the conductivity of the OLED device can be ensured. A distance between the first electrode 61 and the second electrode 63 may be adjusted according to the wavelength of the emitted light, for example, the distance between the two may be an integer multiple of half of the wavelength of the emitted light.

Further, since the conductive scattering film layer 634 has a structure different from that of the plurality of conductive scattering blocks 632, the thickness of the conductive scattering film layer 634 shown in FIG. 1A may be in a range from 2 nm to 7 nm, for example, 2 nm, 3 nm, 4 nm, 5 nm, 6 nm, or 7 nm.

The plurality of conductive scattering blocks 632 shown in FIG. 1B may have a thickness in a range from 5 nm to 20 nm, for example, 5 nm, 6 nm, 7 nm, 8 nm, 9 nm, 10 nm, 11 nm, 12 nm, 13 nm, 14 nm, 15 nm, 16 nm, 17 nm, 18 nm, 19 nm, or 20 nm.

Since the plurality of conductive scattering blocks 632 shown in FIG. 1B do not cover the entire light emitting layer 62, a sum of areas of orthographic projections of the plurality of conductive scattering blocks 632 on the silicon-based substrate may be 30% to 70%, for example, 30%, 40%, 50%, 60% or 70% of an area of an orthographic projection of the first electrode 61 on the silicon-based substrate, so as to facilitate light transmission.

Figure 9A:
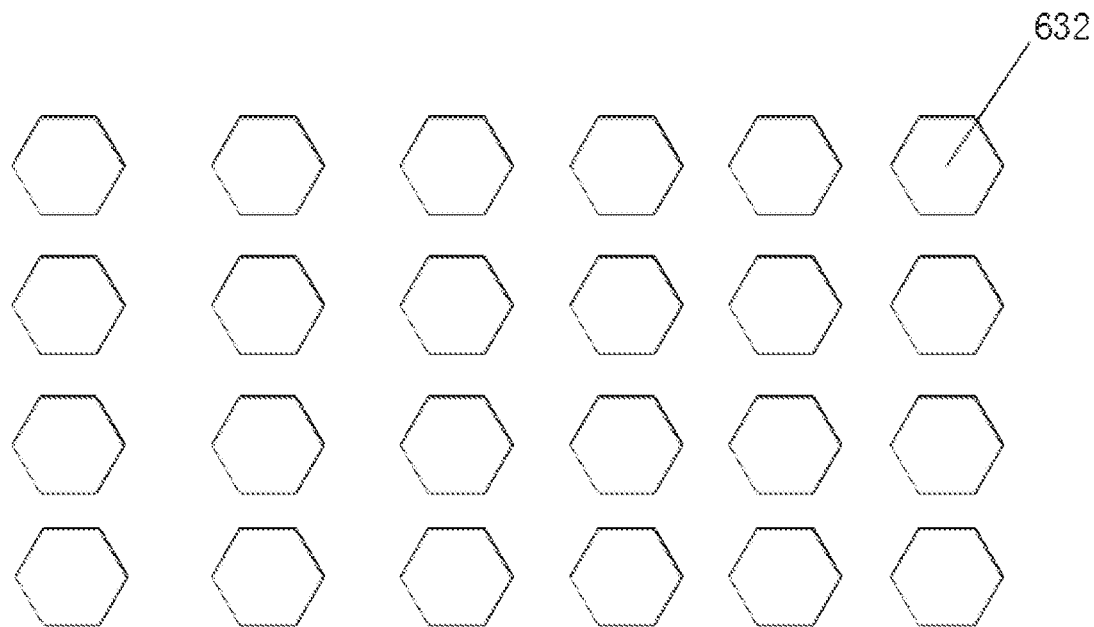
FIG. 9A is a schematic layout of a plurality of conductive scattering blocks according to an embodiment of the present disclosure.
Figure 9B:
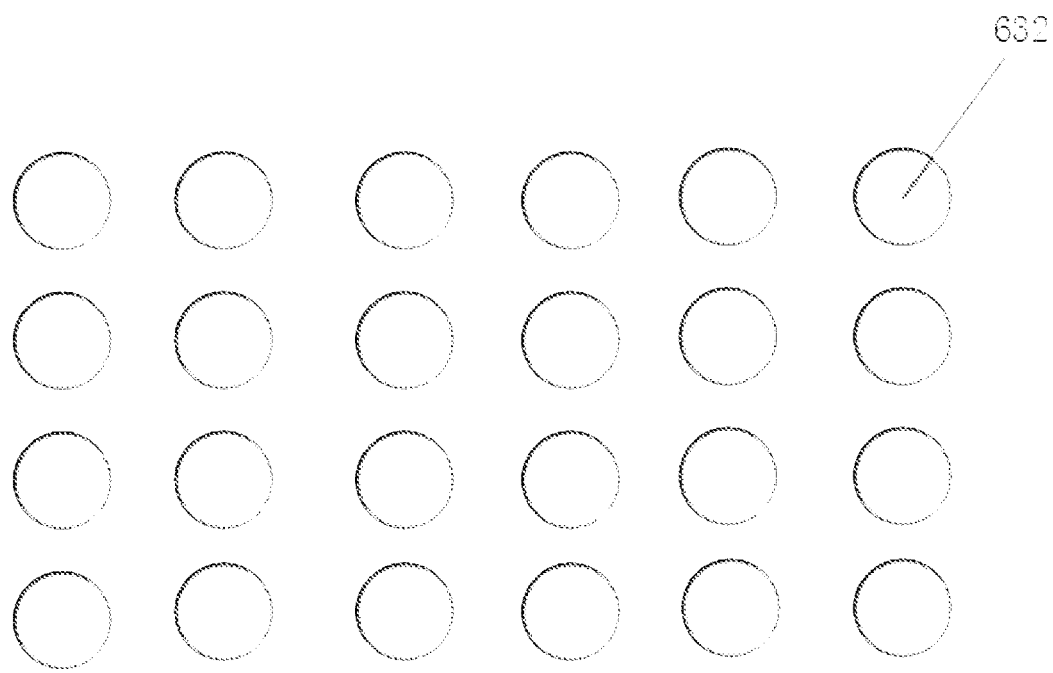
FIG. 9B is a schematic layout of a plurality of conductive scattering blocks according to an embodiment of the present disclosure.

Optionally, the orthographic projections of the plurality of conductive scattering blocks 632 on the silicon-based substrate is uniformly distributed on the silicon-based substrate, as shown in FIGS. 9A and 9B.

Optionally, the orthographic projections of the plurality of conductive scattering blocks 632 on the silicon-based substrate have a same shape, which is similar or identical to a shape of the orthographic projection of the first electrode on the silicon-based substrate. As shown in FIGS. 9A and 9B, each of the plurality of conductive scattering blocks 632 may be hexagonal or circular, which has a shape the same as or similar to the first electrode 61. That is, the first electrode 61 is circular or hexagonal, and each of the plurality of conductive scattering blocks 632 may be correspondingly circular or hexagonal; or the first electrode 61 has a shape similar to that of each of the plurality of conductive scattering blocks 632, for example, the first electrode 61 is circular and each of the plurality of conductive scattering blocks 632 is hexagonal. Further, extension directions of the sides, orientations and values of included angles between the sides (arrangement) of the shape of each of the plurality of conductive scattering blocks 632 are the same as those of the shape of the first electrode 61. The above are merely examples, and each of the plurality of conductive scattering blocks 632 may be rectangular, oval, or have a shape of any polygon, which has a shape the same as or similar to the first electrode 61. The area of each of the plurality of conductive scattering blocks 632 in other projection directions is not limited, and the shape of the projection of each of the plurality of conductive scattering blocks 632 in other projection directions, for example, in the direction perpendicular to the silicon-based substrate, may be rectangular, trapezoidal, or of other shapes.

Optionally, the carrier (electron) mobility of a material of the conductive scattering sub-structure is in a range from $10^{-4}$ cm$^2$V$^{-1}$ s$^{-1}$ to $10^{-4}$ cm$^2$V$^{-1}$ s$^{-1}$, that is, the material of the conductive scattering sub-structure is a semiconductor material, such that an ohmic contact barrier between the conductive scattering sub-structure and the first metal film layer, and between the conductive scattering sub-structure and the second metal film layer, is suitable. Optionally, an optical energy gap of the material of the conductive scattering sub-structure is larger than 2.5 eV, i.e., the conductive scattering sub-structure is transparent and has better light transmission than the first metal film layer and the second metal film layer, to ensure that the light transmission of the second electrode embedded with the conductive scattering sub-structure meets the requirements.

Optionally, the material of the transparent conductive scattering sub-structure includes a transparent organic semiconductor material, a transparent inorganic semiconductor material, a transparent doped inorganic semiconductor material, or a transparent doped organic semiconductor material. The organic semiconductor material may include at least one of 8-hydroxyquinoline aluminum (Alq3); bathophenanthroline (Bphen); and 2, 9-dimethyl-4, 7-biphenyl-1, 10-phenanthroline (BCP). The inorganic semiconductor material may include a carbon material, such as graphene, a nanocarbon material, carbon fiber, a carbonaceous material, and the like. The conductivity of a transparent organic semiconductor material or a transparent inorganic semiconductor material may be improved by doping LiF (lithium fluoride), Liq (8-hydroxyquinoline lithium), Li (lithium), MgP (magnesium phosphide), MgF2 (magnesium fluoride), Al2O3 (aluminum oxide), or the like.

Optionally, a material of the first metal film layer 631 and the second metal film layer 633 may include at least one of a magnesium silver alloy and a silver alloy. The transmissive electrode of the OLED device made of a magnesium-silver alloy, a silver alloy or a thin metal is adopted to participate in optical regulation and maintain the conductivity of the electrode at the same time.

The structure between the first electrode 61 and the second electrode 63 of the OLED device of the present disclosure may further include a hole transport layer, a hole injection layer, an electron injection layer, and an electron transport layer, in addition to the light emitting layer 152. The hole transport layer, the hole injection layer, the light emitting layer, the electron injection layer, and the electron transport layer are sequentially stacked along a direction from the first electrode 61 to the second electrode 63.

Figure 4:
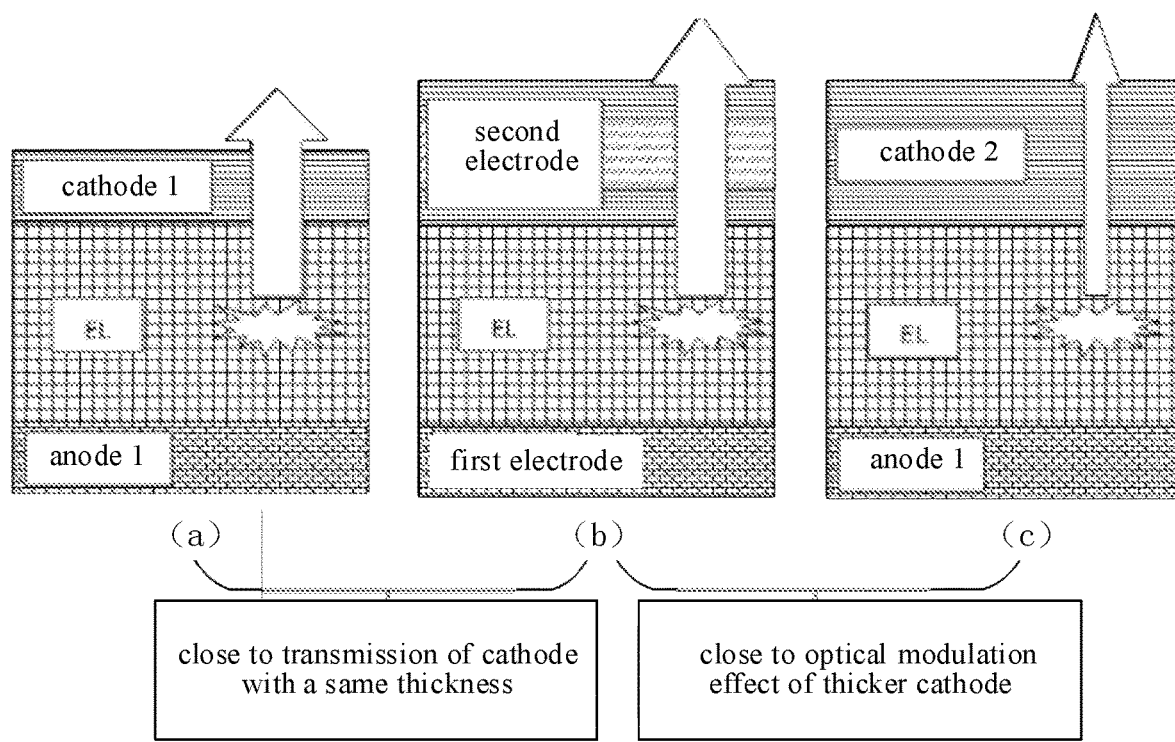
FIG. 4 is a schematic diagram of optical paths of an OLED device of the present disclosure and an OLED device in the related art.
Figure 5:
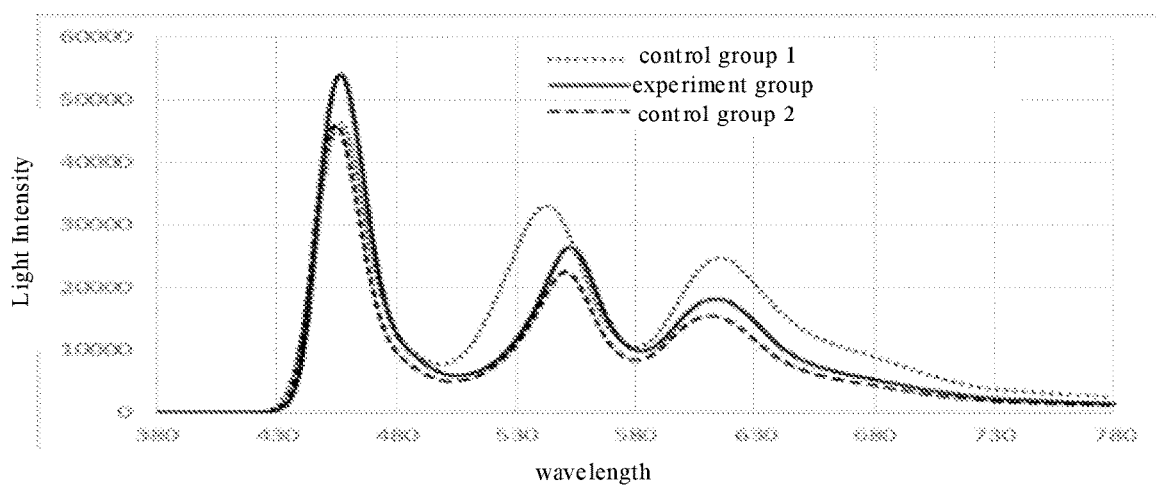
FIG. 5 is a schematic diagram of comparison of results of light transmission between an OLED device of the present disclosure and an OLED device in the related art.

FIG. 4 is a schematic diagram of optical paths of an OLED device of the present disclosure and an OLED device in the related art. FIG. 5 is a schematic diagram of comparison of results of light transmission between an OLED device of the present disclosure and an OLED device in the related art. Taking a top emission OLED device emitting white light as an example, (a) in FIG. 4 shows a cathode 1 with a thickness of 14 nm made of a magnesium-silver alloy in a control group 1, (c) in FIG. 4 shows a cathode 2 with a thickness of 17 nm made of a magnesium-silver alloy in a control group 2, and (b) in FIG. 4 shows a second electrode (i.e., cathode) of a composite structure including magnesium-silver alloy of 8 nm/organic semiconductor material film layer of 3 nm/magnesium-silver alloy of 6 nm in an experiment group. The light exiting direction is indicated in arrows in (a), (b) and (c). A same light transmission of about 25% at a total metal thickness of 14 nm occurs in both the control group 1 and the experiment group. Meanwhile, the experimental results show that under a condition of a same current, a spectral reaction of the experiment group is equivalent to that of the control group 2 where the magnesium-silver alloy of 17 nm is provided. For the blue light with the peak at 460 nm and the green light in a range from 530 nm to 550 nm, the light transmission in the experiment group adopting the composite structure is maintained at 25%, and the spectrum of the experiment group is close to the spectrum of the control group 2 where the cathode 2 of the thickness of 17 nm is provided. In a case where the light emitting intensity is maintained, after testing, the light transmission of the electrode of 17 nm made of the magnesium-silver alloy in the control group 2 is less than 15%. The light emitting intensity in the experiment group is about 12% different from that in the control group 2. Therefore, in the present disclosure, under the condition of maintaining the optical requirements, the composite structure with thin total metal thickness may be used to realize optical modulation under the Fabry-Perot resonance mechanism, which is beneficial to the improvement of the total brightness.

Figure 6:
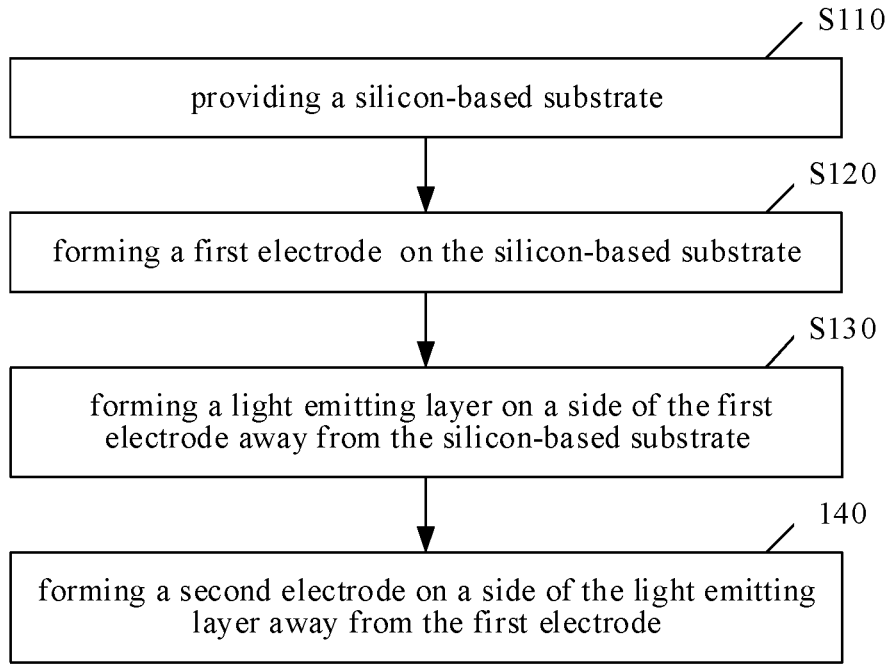
FIG. 6 is a flowchart illustrating a method for manufacturing a silicon-based OLED display substrate according to an embodiment of the present disclosure.

According to another aspect of the present disclosure, a method for manufacturing an OLED device in a silicon-based organic electroluminescent display substrate is further provided. FIG. 6 is a flowchart illustrating a method for manufacturing a silicon-based OLED display substrate according to an embodiment of the present disclosure, and as shown in FIG. 6, the method includes the four steps S110 to S140.

At S110, a silicon-based substrate is provided.

At S120, a first electrode as a reflective electrode (i.e., anode), is formed on the silicon-based substrate.

At S130, a light emitting layer is formed on a side of the first electrode away from the silicon-based substrate.

At S140, a second electrode as a transmissive electrode (i.e., cathode) is formed on a side of the light emitting layer away from the first electrode. The second electrode includes at least one composite structure including: a first metal film layer on a side of the light emitting layer away from the first electrode; a conductive scattering sub-structure on a side of the first metal film layer away from the light emitting layer; and a second metal film layer on a side of the conductive scattering sub-structure away from the first metal film layer.

Figure 7:
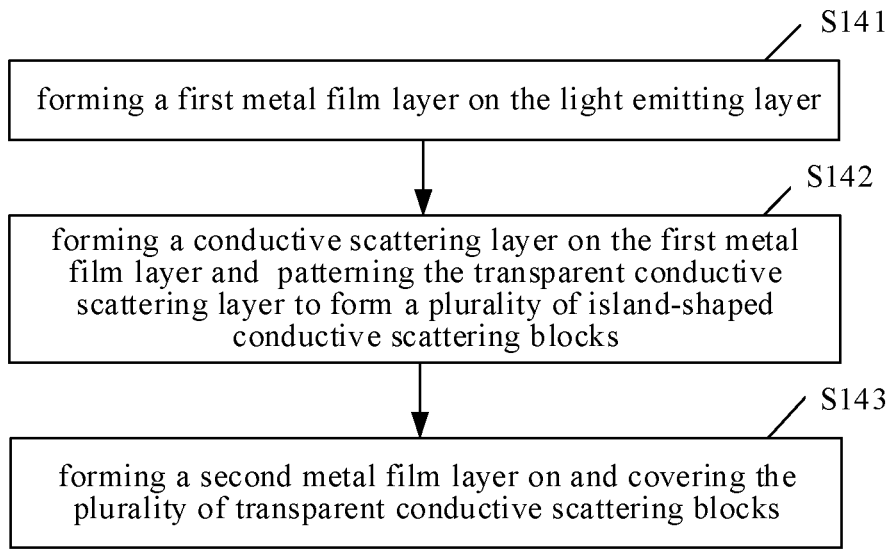
FIG. 7 is a flowchart illustrating a method for manufacturing a second electrode according to an embodiment of the present disclosure.

Optionally, forming the second electrode may include the following steps. FIG. 7 is a flowchart of manufacturing the second electrode according to an embodiment of the present disclosure. First, at step S141, a first metal film layer is formed on the light emitting layer. Then, at step S142, a transparent conductive scattering layer is formed on the first metal film layer, and the transparent conductive scattering layer is patterned to form a plurality of island-shaped conductive scattering blocks. Finally, at step S143, a second metal film layer is formed on and covering the plurality of transparent conductive scattering blocks.

Figure 8:
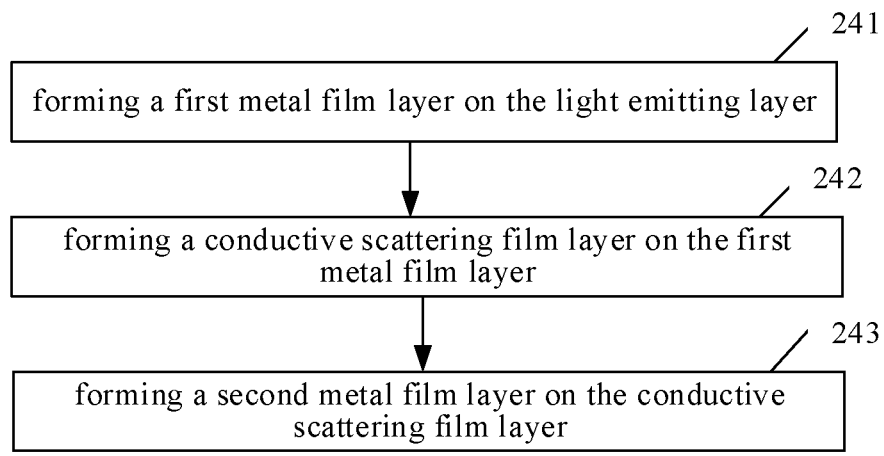
FIG. 8 is a flowchart illustrating a method for manufacturing a second electrode according to an embodiment of the present disclosure.

Optionally, forming the second electrode may include the following steps. FIG. 8 is a flowchart of manufacturing the second electrode according to an embodiment of the present disclosure. First, at step S241, a first metal film layer is formed on the light emitting layer. Then, at step S242, a conductive scattering film layer is formed on the first metal film layer. Finally, at step S243, a second metal film layer is formed on and covering the conductive scattering film layer.

Optionally, a material of the transparent conductive scattering film layer or the plurality of transparent conductive scattering blocks may include an organic semiconductor material, an inorganic semiconductor material, a doped inorganic semiconductor material, or a doped organic semiconductor material. The organic semiconductor material may include Alq3, Bphen, and BCP, and the inorganic semiconductor material may include a carbon material. A material of the first metal film layer and the second metal film layer may include at least one of a magnesium-silver alloy and a silver alloy. A thickness of the second electrode may be in a range from 12 nm to 20 nm, and a thickness of the transparent conductive scattering block may be in a range from 2 nm to 7 nm.

The silicon-based substrate may include a pixel circuit formed on a silicon-based base substrate. The pixel circuit has a driving transistor including a source electrode, a drain electrode, and a gate electrode. The drain electrode of the driving transistor is connected to the first electrode of the OLED device through a via hole in a film layer between the pixel circuit and the OLED device, to drive the OLED device to emit light.

Figure 2:
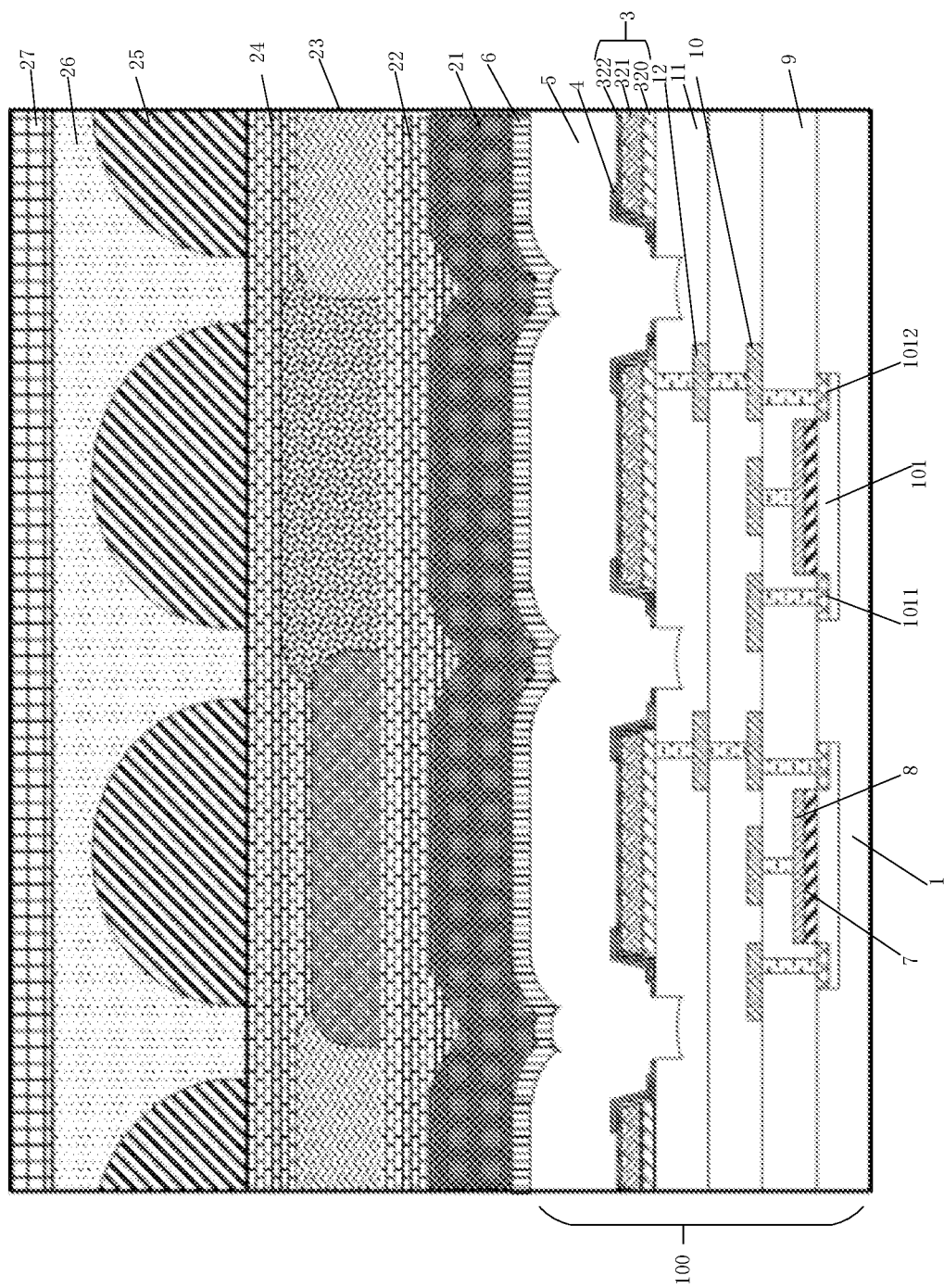
FIG. 2 is a schematic diagram of a structure of a silicon-based OLED display substrate according to an embodiment of the present disclosure.
Figure 3:
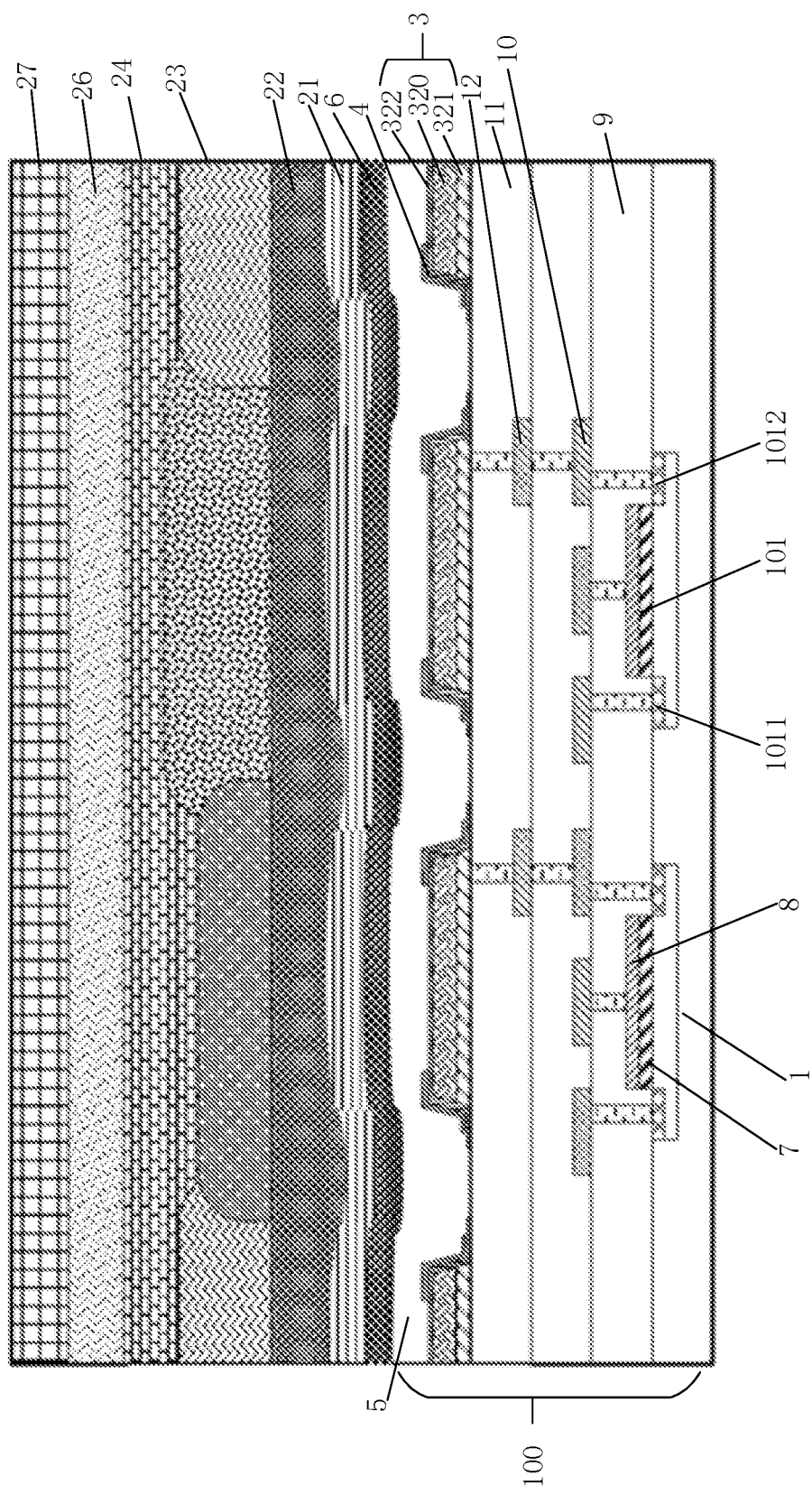
FIG. 3 is a schematic diagram of a structure of a silicon-based OLED display substrate according to an embodiment of the present disclosure.

FIG. 2 is a schematic diagram of a structure of a silicon-based OLED display substrate according to an embodiment of the present disclosure. FIG. 3 is a schematic diagram of a structure of a silicon-based OLED display substrate according to an embodiment of the present disclosure. As shown in FIG. 2, the silicon-based OLED display substrate includes: a silicon-based base substrate 1; an active region 101; a source electrode 1011, a drain electrode 1012; a planarization layer 2; a first electrode layer 3; a pixel defining layer 4; a light emitting layer 5; a second electrode 6; a gate insulating layer 7; a gate electrode 8; a first insulating layer 9; a first routing layer 10; a second insulating layer 11; a second routing layer 12; a first encapsulation layer 21; a surface planarization layer 22; a color filter layer 23; a second encapsulation layer 24; a light condensing structure 25; a third encapsulation layer 26 and a transparent cover plate 27. The first electrode layer 3 includes a first conductive layer 320, a second conductive layer 321, and a third conductive layer 322. The silicon-based substrate 100 includes all structures below the second electrode 6. The structure of the silicon-based OLED display substrate shown in FIG. 3 is substantially the same as that shown in FIG. 2, except that the silicon-based OLED display substrate shown in FIG. 3 does not include the light condensing structure 25, which is not repeated herein.

Since the silicon-based OLED display substrate is provided with the OLED device in the above embodiments of the present disclosure, the light emitting of the display panel can be effectively improved.

According to another aspect of the present disclosure, a display panel is further provided, and includes the display substrate provided in any one of the above embodiments and a driving circuit for driving the display substrate. Since the silicon-based OLED display substrate is provided with the OLED device in the above embodiments of the present disclosure, the light emitting of the display panel can be effectively improved.

It will be understood that the above embodiments are merely exemplary embodiments employed to illustrate the principles of the present disclosure, and the present disclosure is not limited thereto. It will be apparent to those skilled in the art that various changes and modifications can be made therein without departing from the spirit and scope of the present disclosure, and these changes and modifications are to be considered within the scope of the present disclosure.

What is claimed is:

1. A silicon-based organic electroluminescent display substrate, comprising a silicon-based substrate and a plurality of pixel units on the silicon-based substrate, wherein each of the plurality of pixel units comprises:
   a first electrode on a side of the silicon-based substrate;
   a light emitting layer on a side of the first electrode away from the silicon-based substrate; and
   a second electrode on a side of the light emitting layer away from the first electrode,
   wherein the second electrode of at least one of the plurality of pixel units comprises at least one composite structure comprising:
   a first metal film layer on a side of the light emitting layer away from the first electrode;
   a conductive scattering sub-structure on a side of the first metal film layer away from the light emitting layer; and
   a second metal film layer on a side of the conductive scattering sub-structure away from the first metal film layer;
   wherein the first electrode is a reflective electrode, and the second electrode is a transmissive electrode;
   the conductive scattering sub-structure comprises a plurality of conductive scattering blocks;
   the plurality of conductive scattering blocks each have a thickness in a range from 5 nm to 20 nm in a direction perpendicular to the silicon-based substrate;
   a sum of areas of orthographic projections of the plurality of conductive scattering blocks on the silicon-based substrate is 30% to 70% of an area of an orthographic projection of the first electrode on the silicon-based base;
   the orthographic projections of the plurality of conductive scattering blocks on the silicon-based substrate are uniformly distributed on the silicon-based substrate, and
   the orthographic projections of the plurality of conductive scattering blocks on the silicon-based substrate have a same hexagonal or circular shape, and every two adjacent conductive scattering blocks of the plurality of conductive scattering blocks are spaced from each other by a distance to increase light transmission of the second electrode.

2. The display substrate of claim 1, wherein the second electrode has a thickness in a range from 12 nm to 20 nm in a direction perpendicular to the silicon-based substrate.

3. The display substrate of claim 1, wherein shapes of the orthographic projections of the plurality of conductive scattering blocks on the silicon-based substrate are the same, and are the same as a shape of the orthographic projection of the first electrode on the silicon-based substrate.

4. The display substrate of claim 3, wherein a material of the conductive scattering sub-structure has a carrier mobility in a range from $10^{-4}$ $cm^2$ $V^{-1}$ $s^{-1}$ to 10 $cm^2$ $V^{-1}$ $s^{-1}$, and
   an optical energy gap of the material of the conductive scattering sub-structure is greater than 2.5 eV.

5. The display substrate of claim 4, wherein the material of the conductive scattering sub-structure comprises an organic semiconductor material, an inorganic semiconductor material, a doped inorganic semiconductor material or a doped organic semiconductor material.

6. The display substrate of claim 5, wherein the organic semiconductor material comprises 8-hydroxyquinoline aluminium, bathophenanthroline and 2, 9-dimethyl-4, 7-biphenyl-1, 10-phenanthroline.

7. The display substrate of claim 5, wherein the inorganic semiconductor material comprises a carbon material, and
the carbon material comprises at least one of graphene, a nanocarbon material, a carbon fiber, and a carbonic material.

8. The display substrate of claim 5, wherein a dopant material in the doped inorganic semiconductor material or the doped organic semiconductor material comprises at least one of lithium fluoride, 8-hydroxyquinoline lithium, lithium, magnesium phosphide, magnesium fluoride, and aluminum oxide.

9. The display substrate of claim 1, wherein a material of the first and second metal film layers comprises at least one of a magnesium silver alloy and a silver alloy.

10. A display panel, comprising the display substrate of claim 1 and a driving circuit for driving the display substrate.

11. A method for manufacturing the silicon-based organic electroluminescent display substrate of claim 1, comprising:
providing a silicon-based substrate;
forming a first electrode on the silicon-based substrate;
forming a light emitting layer on a side of the first electrode away from the silicon-based substrate, and
forming a second electrode on a side of the light emitting layer away from the first electrode, such that the second electrode comprises at least one composite structure comprising:
a first metal film layer on a side of the light emitting layer away from the first electrode;
a conductive scattering sub-structure on a side of the first metal film layer away from the light emitting layer; and
a second metal film layer on a side of the conductive scattering sub-structure away from the first metal film layer.

12. The method of claim 11, wherein forming the second electrode comprises:
forming the first metal film layer on the light emitting layer;
forming a conductive scattering film layer on the first metal film layer; and
forming the second metal film layer on the conductive scattering film layer.

13. The method of claim 11, wherein forming the second electrode comprises:
forming the first metal film layer on the light emitting layer;
forming a conductive scattering layer on the first metal film layer, and patterning the conductive scattering layer to form a plurality of island-shaped conductive scattering blocks; and
forming the second metal film layer on the plurality of island-shaped conductive scattering blocks to cover the plurality of conductive scattering blocks.

* * * * *